(12) United States Patent
Chaleix et al.

(10) Patent No.: US 11,668,002 B2
(45) Date of Patent: Jun. 6, 2023

(54) COATED METALLIC SUBSTRATE

(71) Applicant: ARCELORMITTAL, Luxembourg (LU)

(72) Inventors: Daniel Chaleix, Verny (FR); Christian Allely, Metz (FR); Eric Silberberg, Haltinne (BE); Sergio Pace, Jodoigne (BE); Lucie Gaouyat, Angleur (BE)

(73) Assignee: ArcelorMittal, Luxembourg (LU)

( * ) Notice: Subject to any disclaimer, the term of this patent is extended or adjusted under 35 U.S.C. 154(b) by 180 days.

(21) Appl. No.: 16/642,559

(22) PCT Filed: Jul. 20, 2018

(86) PCT No.: PCT/IB2018/055407
§ 371 (c)(1),
(2) Date: Feb. 27, 2020

(87) PCT Pub. No.: WO2019/043472
PCT Pub. Date: Mar. 7, 2019

(65) Prior Publication Data
US 2020/0190656 A1    Jun. 18, 2020

(30) Foreign Application Priority Data

Aug. 30, 2017    (WO) .................. PCT/IB2017/001045

(51) Int. Cl.
*C23C 2/02*    (2006.01)
*C23C 14/16*    (2006.01)
(Continued)

(52) U.S. Cl.
CPC ................ *C23C 14/16* (2013.01); *C23C 2/02* (2013.01); *C23C 2/06* (2013.01); *C23C 2/12* (2013.01);
(Continued)

(58) Field of Classification Search
CPC .... C23C 2/02; C23C 2/06; C23C 2/12; C23C 2/36; C23C 14/16; C23C 14/028;
(Continued)

(56) References Cited

U.S. PATENT DOCUMENTS 3,898,052 A * 8/1975 Dean ..................... C23C 10/50
428/673
2006/0177596 A1    8/2006 De Meyer et al.
(Continued)

FOREIGN PATENT DOCUMENTS

EP    1972699 A1    9/2008
GB    1187802 A    4/1970
(Continued)

OTHER PUBLICATIONS

See International Search Report of PCT/IB2018/055407, dated Oct. 10, 2018.
(Continued)

*Primary Examiner* — Hai Y Zhang
(74) *Attorney, Agent, or Firm* — Davidson, Davidson & Kappel, LLC

(57) ABSTRACT

A coated metallic substrate including at least a first coating of aluminum, such first coating having a thickness below 5 μm and being directly topped by a second coating including from 0.5 to 5.9% by weight of magnesium, the balance being zinc.

26 Claims, 2 Drawing Sheets

(51) Int. Cl.
*C23C 2/06* (2006.01)
*C23C 2/12* (2006.01)
*C23C 2/36* (2006.01)
*C23C 14/02* (2006.01)
*C23C 14/24* (2006.01)
*C23C 14/35* (2006.01)
*C23C 14/56* (2006.01)
*C23C 28/02* (2006.01)

(52) U.S. Cl.
CPC .............. *C23C 2/36* (2013.01); *C23C 14/028* (2013.01); *C23C 14/24* (2013.01); *C23C 14/35* (2013.01); *C23C 14/562* (2013.01); *C23C 28/023* (2013.01)

(58) Field of Classification Search
CPC ....... C23C 14/24; C23C 14/35; C23C 14/562; C23C 14/246; C23C 14/025; C23C 14/165; C23C 14/30; C23C 14/568; C23C 14/228; C23C 14/56; C23C 28/02; C23C 28/023; C23C 28/021; C23C 30/00; C25D 7/0614
See application file for complete search history.

(56) References Cited

U.S. PATENT DOCUMENTS

| | | | |
|---|---|---|---|
| 2010/0104752 A1* | 4/2010 | Choquet | C23C 14/562 |
| | | | 420/513 |
| 2012/0085466 A1* | 4/2012 | Lupp | C23C 2/12 |
| | | | 148/400 |
| 2015/0013409 A1 | 1/2015 | Monnoyer et al. | |
| 2015/0352812 A1 | 12/2015 | Jung et al. | |
| 2017/0114467 A1 | 4/2017 | Chaleix et al. | |
| 2017/0260599 A1 | 9/2017 | Puerta Velasquez et al. | |
| 2017/0350029 A1* | 12/2017 | Hong | C23C 28/023 |
| 2018/0112305 A1 | 4/2018 | Choquet et al. | |

FOREIGN PATENT DOCUMENTS

| | | |
|---|---|---|
| JP | H02159366 A | 6/1990 |
| JP | 2017512909 A | 5/2017 |
| JP | 2017145508 | 8/2017 |
| KR | 100775241 B1 | 11/2007 |
| RU | 2360037 C2 | 6/2009 |
| UA | 105879 C2 | 6/2014 |
| WO | 2014037627 A1 | 3/2014 |
| WO | 2019043473 A | 3/2019 |

OTHER PUBLICATIONS

Niu et al:"Microstructure Evolution and Corrosion Behavios of Degradable ZN—7Mg Alloy After Heat Treatment," vol. 37, No. 4, Aug. 2017, 379-353, see partial machine translation, May 31, 2013.
"Quality Control Theory and Technology of Plastic Forming Parts," May 31, 2013, see partial machine translation "Zn—7Mg".
"Modern Continuous Hot Dip Galvanizing of Steel Strips," Jan. 31, 2007, see partial machine translation, Jan. 31, 2007.

* cited by examiner

COATED METALLIC SUBSTRATE

The present invention relates to a coated metallic substrate and a method for the manufacture of this coated metallic substrate. The invention is particularly well suited for automotive industry.

BACKGROUND

Zinc based coatings are generally used because they allows for a protection against corrosion thanks to barrier protection and cathodic protection. The barrier effect is obtained by the application of a metallic coating on steel surface. Thus, the metallic coating prevents the contact between steel and corrosive atmosphere. The barrier effect is independent from the nature of coating and substrate. On the contrary, sacrificial cathodic protection is based on the fact that zinc is a metal less noble that steel. Thus, if corrosion occurs, zinc is consumed preferentially to steel. Cathodic protection is essential in areas where steel is directly exposed to corrosive atmosphere, like cut edges where surrounding zinc will be consumed before steel.

However, when heating steps are performed on such zinc coated steel sheets, for example press hardening or welding, cracks are observed in steel which spread from the coating. Indeed, occasionally, there is a reduction of metal mechanical properties due to the presence of cracks in coated steel sheet after heating steps. These cracks appear with the following conditions: high temperature; contact with a liquid metal having a low melting point (such as zinc) in addition to stress; heterogeneous diffusion of molten metal with substrate grain bulk and boundary. The designation for such phenomenon is liquid metal embrittlement (LME), also called liquid metal assisted cracking (LMAC).

Other metallic coatings usually used for the production of automotive vehicle are aluminum and silicon based coatings. Usually, the steel sheets coated with such coatings are formed by press hardening process. When press hardening process is performed, there is no microcrack in steel due to the presence of an intermetallic layer Al—Si—Fe. Moreover, they have a good aptitude for painting. They allow for a protection by barrier effect and can be welded. However, they do not allow for a cathodic protection or they have a very low cathodic protection.

The patent KR100775241 discloses a Zn—Mg alloy coated steel sheet and a method for manufacturing the Zn—Mg alloy coated steel sheet are provided, wherein the Zn—Mg alloy coated steel sheet has more improved adhesion and corrosion resistance by forming an Al—Si alloy film between a base steel sheet and a Zn—Mg alloy film. A Zn—Mg alloy coated steel sheet comprises an Al—Si alloy film which is formed on a base steel sheet and has a thickness of 0.1 to 1.0 µm, and a Zn—Mg alloy film which is formed on the Al—Si alloy film and has a thickness of 0.5 to 10 µm. The Zn—Mg alloy film comprises 10 to 15% by weight of Mg. The Al—Si alloy film is formed by an electron beam method or a sputtering method, and the Zn—Mg alloy film is formed by one method selected from the group consisting of a thermal evaporation method, an electron beam method, a sputtering method, an ion plating method, and an electromagnetic levitation method.

SUMMARY OF THE INVENTION

Despite, the Zn—Mg coated metallic substrate has a corrosion resistance, the high amount of Mg in the ZnMg coating can lead to surface defects and a decrease of corrosion due to the formation of Mg oxide on the coating surface. Moreover, the above combination of Al—Si with a thickness between 0.1 and 1.0 µm and Zn—Mg comprising 10 to 15% of Mg and having a thickness between 0.5 and 10 µm does not have a sufficient protection against corrosion, i.e. a barrier effect in addition to a sacrificial protection.

An object of the invention is to provide a coated metallic substrate having a reinforced protection against corrosion, i.e. a sacrificial cathodic protection in addition to barrier protection, and which does not lead to LME issues. It aims to make available, in particular, an easy to implement method in order to obtain such coated metallic substrate.

In terms of sacrificial protective corrosion, electrochemical potential has to be at least 50 mV more negative than the potential of the metallic substrate. For example, in case of a steel substrate, a maximum potential of −0.78V with respect to a saturated calomel electrode (SCE) is needed. It is preferable not to decrease the potential at a value of −1.4V/SCE, even −1.25V/SCE which would involve a fast consumption and would finally decrease the period of protection of steel.

The present invention provides a coated metallic substrate comprising at least a first coating consisting of aluminum, such first coating having a thickness between 2 and 4 µm and being directly topped by a second coating comprising from 0.5 to 5.9% by weight of magnesium, the balance being zinc.

A The present invention also provides a method for the manufacture of the coated metallic substrate comprising the following steps: provision of a metallic substrate, optionally, a surface preparation step of the metallic substrate, deposition of the first coating consisting of aluminum, such first coating having a thickness between 2 and 4 µm and deposition of the second coating comprising from 0.5 to 5.9% by weight of magnesium, the balance being zinc.

The present invention also provides a method for manufacturing an automotive vehicle part comprising: manufacturing the automotive vehicle part using the coated metallic substrate.

The present invention also provides an installation for continuous vacuum deposition of coatings on a running metallic substrate using the method above to obtain the coated metallic substrate comprising: optionally, an intermediate section comprising a magnetron cathode pulverization device; a first section including an electron beam evaporation device; and a second section including a jet vapor evaporation device.

Other characteristics and advantages of the invention will become apparent from the following detailed description of the invention.

BRIEF DESCRIPTION OF THE DRAWINGS

To illustrate the invention, various embodiments and trials of non-limiting examples will be described, particularly with reference to the following Figures.

DETAILED DESCRIPTION

Figure 1:
FIG. 1 is an illustration of the specimen used for the LME test.

In all the figures, the thickness of the layers represented is exclusively for purposes of illustration and cannot be considered to be a representation of the different layers to scale.

The following terms will be defined:

"wt. %" means the percentage by weight.

The inventions relates to a coated metallic substrate comprising at least a first coating consisting of aluminum, such first coating having a thickness below 5 μm and being directly topped by a second coating comprising from 0.5 to 5.9% by weight of magnesium, the balance being zinc.

The first coating consists of aluminum, i.e. the amount of aluminum in the first coating is above 99.0% by weight.

The first coating having a thickness below 5 μm means that the thickness of the first coating is above 0 μm and below 5 μm.

Without willing bound by any theory, it is believed that the above coated metallic substrate allows for a high protection against corrosion. Indeed, it seems that the first layer consisting of aluminum provides a high barrier effect mainly due to the presence of aluminum. It is believed that the thickness of the first coating has to be below 5 μm since the barrier effect is highly obtained and above 5 μm there is a risk to significantly reduce the productivity and over complicate the deposition method. Moreover, it is believed that the second coating allows for a high sacrificial protection mainly due to the combination of magnesium and zinc, the magnesium being in a specific amount. Additionally, when the amount of Mg is above 5.9%, it seems that powdering problems occurs in the second coating. Finally, the coated metallic substrate having the first and second layers has a high resistance to LME. Consequently, with the specific coated metallic substrate according to the present invention, it is possible to obtain a coated metallic substrate having a high barrier effect, a high sacrificial protection in addition to a resistance to LME.

In a preferred embodiment, the first coating has a thickness between 2 and 4 μm.

Preferably, the second coating has a thickness between 1 and 10 μm.

Advantageously, the second coating comprises from 0.5 to 4.5%, more preferably from 0.5 to 2.0%, by weight of magnesium.

In another preferred embodiment, the second coating comprises from 2.0 to 5.0% by weight of magnesium.

In a preferred embodiment, the second coating does not comprise at least one of the following elements chosen among: aluminum, silicon and copper.

Preferably, the second coating consists of zinc and magnesium.

Advantageously, the microstructure of the second coating comprises $Mg_2Zn_{11}$ phases in a Zn matrix. Indeed, without willing to be bound by any theory, if the second coating comprises at least 95% by weight of $Mg_2Zn_{11}$ in Zn matrix instead of less than 95% by weight of $Mg_2Zn_{11}$ phases in a Zn matrix, there is a risk to obtain a brittle coating allowing powdering problems. For example, the second coating comprises less than 85%, preferably less than 75% by weight of $Mg_2Zn_{11}$ in Zn matrix.

Preferably, an intermediate layer is present between the metallic substrate and the first coating, such intermediate layer comprising iron, nickel, chromium and optionally titanium. Without willing to be bound by any theory, it seems that the intermediate coating layer further improves the adhesion of the first coating on a metallic substrate.

Thus in a preferred embodiment, the intermediate layer comprises at least 8% by weight nickel and at least 10% by weight chromium, the rest being iron. For example, the layer of metal coating is 316 stainless steel including 16-18% by weight Cr and 10-14% by weight Ni, the balance being Fe.

In another preferred embodiment, the intermediate layer comprises Fe, Ni, Cr and Ti wherein the amount of Ti is above or equal to 5 wt. % and wherein the following equation is satisfied: 8 wt. %<Cr+Ti<40 wt. %, the balance being Fe and Ni, such intermediate coating layer being directly topped by a coating layer being an anticorrosion metallic coating.

The metallic substrate can be chosen among: aluminum substrate, steel substrate, stainless steel substrate, copper substrate, iron substrate, copper alloys substrate, titanium substrate, cobalt substrate or nickel substrate.

The present invention also relates to a method for the manufacture of a coated metallic substrate according to the present invention comprising the following steps:

A. provision of a metallic substrate,
B. optionally, a surface preparation step of the metallic substrate,
C. deposition of the first coating consisting of aluminum, such first coating having a thickness below 5 μm and
D. deposition of the second coating comprising from 0.5 to 5.9% by weight of magnesium, the balance being zinc.

Preferably, in when step B) is performed, the surface treatment is chosen from: shot blasting, pickling, etching, polishing, sand blasting, grinding and the deposition of an intermediate layer comprising iron, nickel, chromium and optionally titanium. Preferably, the surface treatment consists in depositing an intermediate layer on the metallic substrate. Moreover, the intermediate layer permits to avoid the removal of the oxide layer naturally present on the metallic substrate.

Preferably, In steps C) and D), the deposition of the first and second coatings independently of one another are performed by a hot-dip coating, by electro-deposition process or by vacuum deposition. For example, the first coating is deposited by hot-dip and the second coating by vacuum deposition. In another example, the first and seconds coatings are deposited by vacuum deposition.

In steps C) and D), when vacuum deposition is performed, the first and second coatings independently of one another are deposited by magnetron cathode pulverization process, jet vapor deposition process, electromagnetic levitation evaporation process or electron beam physical vapor deposition. For example, the first coating is deposited by magnetron cathode pulverization process and the second coating is deposited by jet vapor deposition process.

The present invention also relates to the use of the coated metallic substrate according to the present invention for the manufacture of a part of an automotive vehicle.

Finally, the present invention relates to an installation 100 (shown schematically) for continuous vacuum deposition of coatings on a running metallic substrate 10 using the method according to the present invention for the manufacture of a coated metallic substrate according to the present invention comprising in the following order:

A. Optionally, an intermediate section 20 comprising a magnetron cathode pulverization device 120,
B. A first section 30 comprising an electron beam evaporation device 130 to deposit a first coating 14 based on aluminum and
C. A second section 40 comprising a jet vapor evaporation device 140 to deposit a second coating 16.

Preferably, when the intermediate section 20 is present, the magnetron cathode pulverization device 120 comprises a vacuum deposition chamber 122 comprising one target 124 made of iron, chromium, nickel and optionally titanium and a plasma source 126 to deposit an intermediate layer 12 comprising iron, nickel, chromium and optionally titanium on the metallic substrate.

In this case, inert gas is injected into the vacuum deposition chamber being at a pressure between $10^{-4}$ and $10^{-7}$ bar. The plasma source creates a plasma which electrically charges the gas. Surface atoms of the target are physically ejected by the bombardment of energetic particles (ions) created in a plasma. Ejected atoms deposit on the metallic substrate.

In the first section 30, the electron beam evaporation device 130 comprises a vacuum deposition chamber 132 comprising an evaporation crucible 134 comprising metal consisting of aluminum, a heating device 138 and an electron gun 136.

In the second section 40, the jet vapor evaporation device 140 comprises a vacuum deposition chamber 142 comprising a vapor jet coater 146 and at least one evaporation crucible 144 suited to feed the vapor jet coater with a vapor comprising from 0.5 to 5.9% by weight of magnesium, the balance being zinc.

Preferably, the vapor jet coater is a sonic vapor jet coater and the evaporation crucible comprises an induction heater.

Advantageously, a recharging furnace is placed beneath the evaporation crucible and is adapted to be maintained at atmospheric pressure. More preferably, the recharging furnace is connected to a metal ingot feed means.

In the vacuum deposition chamber, beside the face of the metallic substrate which has to be coated, there is a vapor jet coater. This coater is suited to spray a metal alloy vapor comprising from 0.5 to 5.9% by weight of magnesium, the balance being zinc onto the running substrate.

The vapor jet coater is mounted on an evaporation crucible suited to feed the vapor jet coater with a vapor comprising from 0.5 to 5.9% by weight of magnesium, the balance being zinc. In one preferred embodiment, one evaporation crucible is suited to contain a metal alloy bath comprising magnesium and zinc generating the vapor to be deposited on the substrate. In another preferred embodiment, two evaporation crucibles are used, one evaporator crucible containing magnesium and one evaporator crucible containing zinc, the mixture of zinc and magnesium vapors is deposited on the substrate. Preferably, the at least evaporation crucible is preferably located in the deposition chamber.

The evaporation crucible can be provided with heating means enabling the metal alloy vapor to form and to feed the vapor jet coater. The evaporation crucible is advantageously provided with an induction heater which has the advantage of making the stirring and the composition homogenization of the metal alloy bath easier.

The pressure in the evaporation crucible depends on the bath temperature and on the metal bath composition. It generally varies between $10^{-3}$ and $10^{-1}$ bar. Accordingly, the pressure in the deposition chamber is kept below the one in the evaporation crucible (typically around $10^{-4}$ bar).

The at least evaporation crucible can be connected to a continuous feeding system of zinc and/or magnesium. The continuous feeding comprises preferably a recharging furnace suited to feed the evaporation crucible with zinc in molten state and capable of maintaining a constant level of liquid in the evaporation crucible. the recharging furnace is preferably located outside of the vacuum deposition chamber. The recharging furnace is preferably placed beneath the evaporation crucible and adapted to be maintained at atmospheric pressure. Due to the height between the evaporation crucible and the recharging furnace and to the pressure difference created between them, the molten main element goes up in the evaporation crucible by barometric effect as the metal bath evaporates. This ensures a continuous feeding of the evaporation crucible and contributes to maintaining a constant level of liquid in the evaporation crucible, whatever the line speed. Preferably, the continuous feeding further comprises a feeding unit suited to be fed with magnesium in solid state and suited to feed the evaporation crucible with the at least one additional element indifferently in molten state, in solid state or partially in solid state.

The invention will now be explained in trials carried out for information only. They are not limiting.

EXAMPLES

For all samples, the chemical composition of the steel sheet used is as follows: 0.2% by weight of C, 1.5% by weight of Si, 2% by weight of Mn, 0.04% by weight of Al, the balance being iron.

For Trial 1, a coating of Zn was deposited by electrodeposition on a steel sheet.

For Trials 2 and 3, a coating comprising 4% by weight of magnesium, the balance being zinc was deposited by magnetron cathode pulverization process.

For Trials 4 and 5, an intermediate layer being 316 stainless steel including 16-18% by weight Cr and 10-14% by weight Ni, the balance being Fe was deposited by magnetron cathode pulverization, a first coating of aluminum was deposited by electron beam deposition and a second coating comprising 4% by weight of magnesium, the balance being zinc was deposited by JVD.

For Trial 6, no coating was deposited on the steel sheet.

Example 1: LME Test

In order to measure LME sensitivity, high temperature tensile test was performed in conditions as close as possible to spot welding conditions.

Tensile specimens are illustrated in FIG. 1. Two holes in the heads are machined to inserts pins and thus ensuring no sliding during the test.

Then, a preload force of 1 kN is applied on each specimen. The specimens are heated at a heating rate about 1000° C./s to reach a temperature between 750 and 950° C. When the temperature is reached, displacement is applied to specimens until a full failure. A strain rate of 3 mm/s was used during the test.

Stress-strain curves are determined and analyzed. The derived of this stress-strain curve is calculated and drawn. Steel elongation when the strain derivative is minimum, corresponds to the fracture of the specimen. If this fracture results from an LME phenomenon, i.e. if liquid zinc is present in cracks, this elongation is defined as the "critical LME elongation value". If this fracture is a ductile fracture, the elongation is defined as "critical elongation value". This value then plotted as a function of the temperature of the tensile test.

Results are shown in the following Table 1: 0 means excellent, in other words, there is no liquid zinc in cracks, i.e. the fracture is ductile; 1 means bad, in other words, liquid zinc is present in cracks corresponding to LME cracks.

| Trials | Coating 1st coating | Thickness (μm) | 2nd coating | Thickness (μm) | Temperature (°C.) | Critical LME elongation or Critical elongation value (mm) | Critical LME cracks |
|---|---|---|---|---|---|---|---|
| 1 | Zn (EG) | 7.5 | — | — | 750 | 0.6 | 1 |
|   |   |   |   |   | 800 | 0.7 | 1 |
|   |   |   |   |   | 850 | 1.2 | 1 |
|   |   |   |   |   | 900 | 0.9 | 1 |
|   |   |   |   |   | 950 | 0.6 | 1 |
| 4* | Al | 3 | ZnMg(wt. 4%) | 2.5 | 750 | 4 | 0 |
|   |   |   |   |   | 800 | 3.8 | 0 |
|   |   |   |   |   | 850 | 3.6 | 0 |
|   |   |   |   |   | 900 | 3 | 0 |
|   |   |   |   |   | 950 | 3.2 | 0 |
| 5* | Al | 3 | ZnMg(wt. 4%) | 5 | 750 | 3.8 | 0 |
|   |   |   |   |   | 800 | 3.2 | 0 |
|   |   |   |   |   | 850 | 2.8 | 0 |
|   |   |   |   |   | 900 | 2.9 | 0 |
|   |   |   |   |   | 950 | 3.7 | 0 |
| 6 | — | — | — | — | 750 | 3.2 | 0 |
|   |   |   |   |   | 800 | 3.8 | 0 |
|   |   |   |   |   | 850 | 3.2 | 0 |
|   |   |   |   |   | 900 | 2.9 | 0 |
|   |   |   |   |   | 950 | 3.1 | 0 |

*according to the present invention.

Trials 4 and 5 according to the present invention show excellent resistance to LME at the same level as the bare steel, i.e. Trial 6.

Example 2: Electrochemical Behavior Test

Trials 1 to 5 were prepared and subjected to an electrochemical potential test.

A test consisting in measuring the electrochemical potential of the coated steel surface sheet was realized. Steel sheets and coatings were separated and dipped in a solution comprising 5% by weight of sodium chloride at pH 7. A saturated calomel electrode (SCE) was also immersed into the solution. The coupling potential of the surface was measured over time. Results are shown in the following Table 2:

| Trials | Coating 1st coating | Thickness (μm) | 2nd coating | Thickness (μm) | Electrochemical potential (V/SCE) |
|---|---|---|---|---|---|
| 1 | Zn (EG) | 7.5 | — | — | −1.05 |
| 2 | ZnMg (wt. 4%) | 2.5 | — | — | −1.05 |
| 3 | ZnMg (wt. 4%) | 5 | — | — | −1.05 |
| 4* | Al | 3 | ZnMg (wt. 4%) | 2.5 | −1.06 |
| 5* | Al | 3 | ZnMg (wt. 4%) | 5 | −1.06 |

*according to the present invention.

All tested coatings have a similar electrochemical potential and are sacrificial for steel. Coupling potential of all Trial is under −0.78V/SCE as required, i.e. the minimum electrochemical potential for having sacrificial protection against corrosion.

Example 3: Corrosion Test

Firstly, Trials 1 to 5 were scratched through the coating until the metallic substrate on a width of 1 mm.

Figure 2:
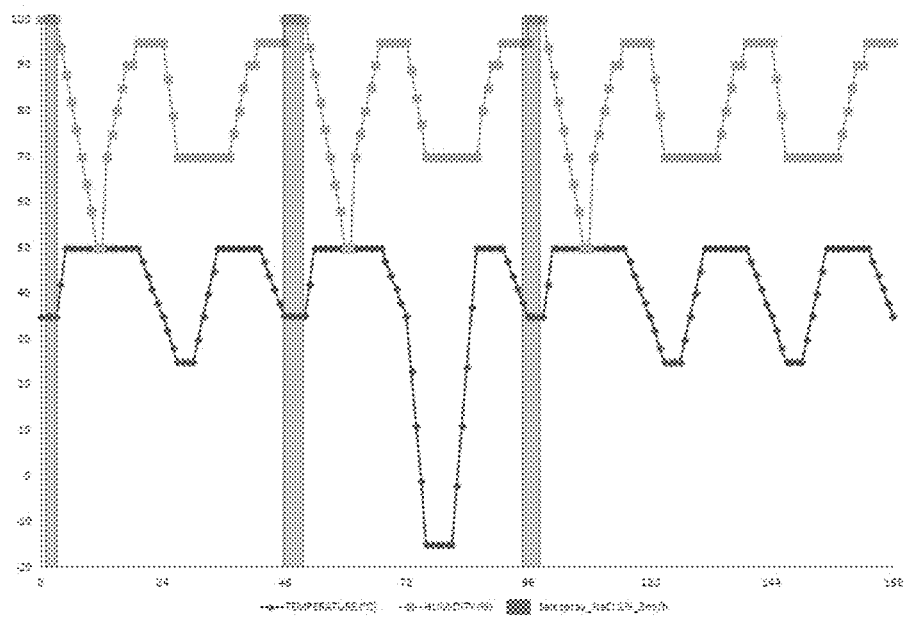
FIG. 2 is a corrosion cycle according to the norm VDA 233-102.
Figure 3:
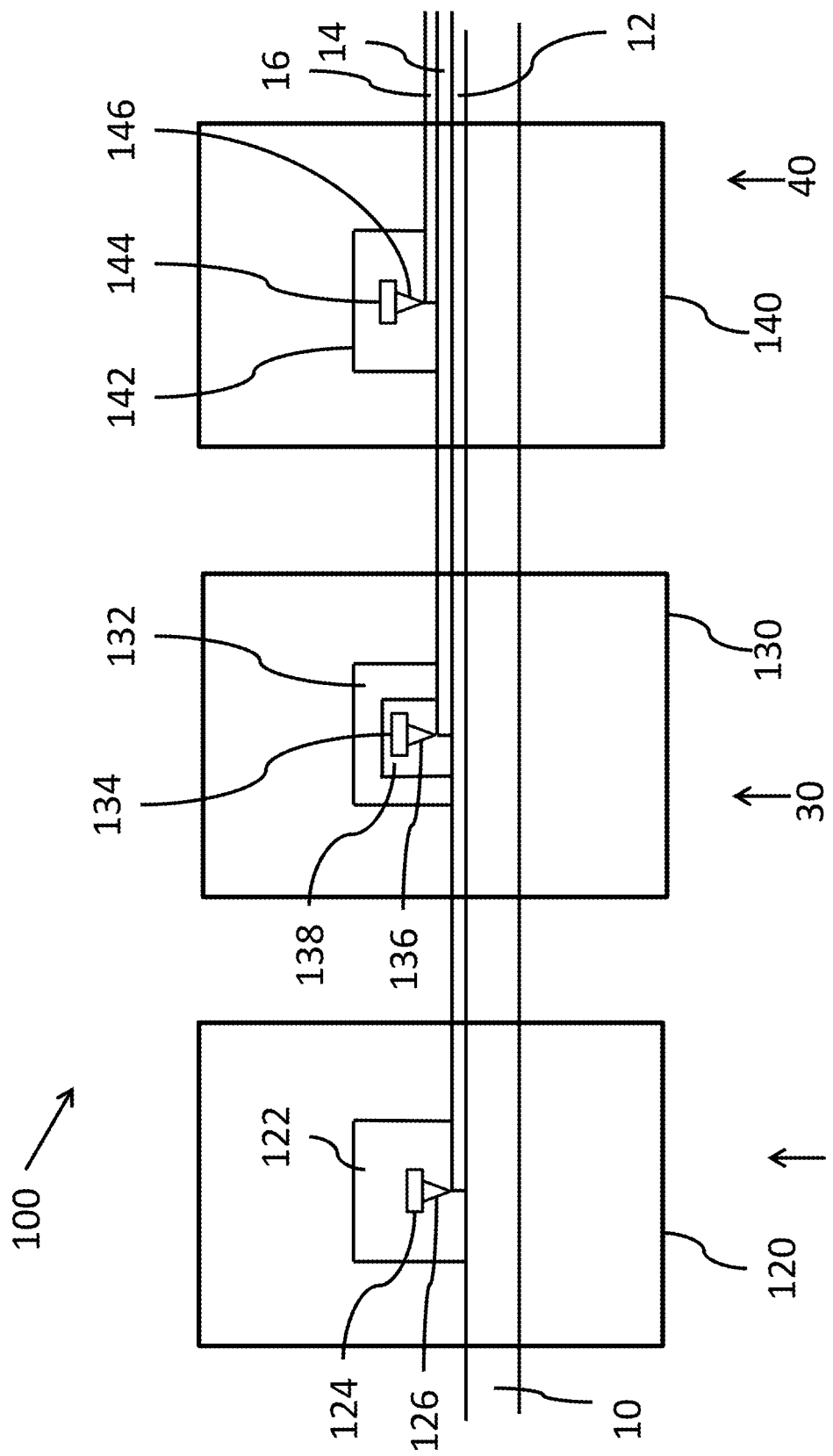
FIG. 3 shows schematically an installation according to an embodiment of the present invention.

A test, consisting in submitting these Trials 1 to 5 to corrosion cycles according to the norm VDA 233-102, was then realized. Trials were put in a chamber wherein an aqueous solution of sodium chloride of 1% by weight was vaporized on trials with a rate of flow of 3 mL·h$^{-1}$. The temperature varied from 50 to −15° C. and the humidity rate varied from 50 to 100%. FIG. 2 illustrates one cycle corresponding to 168 hours, i.e. one week.

The amount of red rust was observed around the scratch, i.e. the front face, and in the scratch with a software and by naked eyes: 0% means excellent, in other words, there is no red rust and 100% means very bad, in other words, 100% of the Trial is covered by red rust. Results are shown in the following Table 3:

| Trials | Coating 1st coating | Thickness (μm) | 2nd coating | Thickness (μm) | Front face-Red rust (wt. %) 1 cycle | 3 cycles | 6 cycles | 7 cycle | scratch-Red rust (wt. %) 1 cycles | 3 cycles | 6 cycles | 7 cycles |
|---|---|---|---|---|---|---|---|---|---|---|---|---|
| 1 | Zn (EG) | 7.5 | — | — | 1 | 8 | 87 | 100 | 0 | 0 | 100 | 100 |

-continued

| Trials | 1st coating | Thickness (μm) | 2nd coating | Thickness (μm) | Front face-Red rust (wt. %) | | | | scratch-Red rust (wt. %) | | | |
|---|---|---|---|---|---|---|---|---|---|---|---|---|
| | | | | | 1 cycle | 3 cycles | 6 cycles | 7 cycle | 1 cycles | 3 cycles | 6 cycles | 7 cycles |
| 2 | ZnMg (wt. 4%) | 2.5 | — | — | 0 | 5 | 23 | 31 | 0 | 0 | 100 | 100 |
| 3 | ZnMg (wt. 4%) | 5 | — | — | 0 | 1 | 4 | 6 | 0 | 0 | 100 | 100 |
| 4* | Al | 3 | ZnMg (wt. 4%) | 2.5 | 0 | 1 | 4 | 7 | 0 | 0 | 16 | 20 |
| 5* | Al | 3 | ZnMg (wt. 4%) | 5 | 0 | 0 | 1 | 1 | 0 | 0 | 12 | 13 |

*according to the present invention.

Trials 4 and 5 according to the present invention have a lower amount of red rust compared to Trials 1 to 3.

What is claimed is:

1. A coated metallic substrate comprising:
   a metallic substrate; and
   a first coating on the metallic substrate, the first coating consisting of aluminum and having a thickness between 2 and 4 μm and being directly topped by a second coating including from 0.5 to 5.9% by weight of magnesium, a balance of the second coating being zinc.

2. The coated metallic substrate as recited in claim 1 wherein the second coating has a thickness between 1 and 10 μm.

3. The coated metallic substrate as recited in claim 1 wherein the second coating comprises from 0.5 to 4.5% by weight of magnesium.

4. The coated metallic substrate as recited in claim 3 wherein the second coating comprises from 0.5 to 2.0% by weight of magnesium, the balance being zinc.

5. The coated metallic substrate as recited in claim 1 wherein the second coating comprises from 2.0 to 5.0% by weight of magnesium, the balance being zinc.

6. The coated metallic substrate as recited in claim 1 wherein the second coating does not comprise at least one of the following elements chosen among: aluminum, silicon and copper.

7. The coated metallic substrate as recited in claim 1 wherein the second coating consists of zinc and magnesium.

8. The coated metallic substrate as recited in claim 1 wherein the microstructure of the second coating comprises less than 95% by weight of Mg2Zn11 phases in a Zn matrix.

9. The coated metallic substrate as recited in claim 1 further comprising an intermediate layer between the metallic substrate and the first coating, the intermediate layer including iron, nickel, and chromium.

10. The coated metallic substrate as recited in claim 9 wherein the intermediate layer further includes titanium.

11. The coated metallic substrate as recited in claim 10, wherein the intermediate layer comprises Fe, Ni, Cr and Ti wherein an amount of Ti is above or equal to 5 wt. % and wherein the following equation is satisfied: 8 wt. %<Cr+Ti<40 wt. %, the balance being Fe and Ni.

12. The coated metallic substrate as recited in claim 9, wherein the intermediate layer comprises at least 8% by weight nickel and at least 10% by weight chromium, a balance being iron.

13. The coated metallic substrate as recited in claim 9, wherein the intermediate layer comprises 16-18% by weight chromium, 10-14% by weight nickel, a balance being iron.

14. The coated metallic substrate as recited in claim 1 wherein the metallic substrate selected from one of the group consisting of: aluminum substrate, steel substrate, stainless steel substrate, copper substrate, iron substrate, copper alloys substrate, titanium substrate, cobalt substrate and nickel substrate.

15. A method for the manufacture of the coated metallic substrate as recited in claim 1, the method comprising the following steps:
   providing the metallic substrate;
   depositing the first coating consisting of aluminum at a thickness between 2 and 4 μm; and
   depositing the second coating including from 0.5 to 5.9% by weight of magnesium, the balance being zinc.

16. The method as recited in claim 15 further comprising preparing a surface of the metallic substrate after the providing step and before the depositing of the first coating.

17. The method as recited in claim 16 wherein the preparing of the surface includes at least one of the following group consisting of: shot blasting, pickling, etching, polishing, sand blasting, grinding and deposition of an intermediate layer comprising iron, nickel, chromium and optionally titanium.

18. The method as recited in claim 15 wherein the depositing of the first and second coatings occurs independently from each other and is performed by a hot-dip coating, by electro-deposition process or by vacuum deposition.

19. The method as recited in claim 18 wherein the depositing of the first and second coating occurs by vacuum deposition, and the first and second coatings independently from each other are deposited by magnetron cathode pulverization process, jet vapor deposition process, electromagnetic levitation evaporation process or electron beam physical vapor deposition.

20. A method for manufacturing an automotive vehicle part comprising: manufacturing the automotive vehicle part using the coated metallic substrate as recited in claim 1.

21. An installation for continuous vacuum deposition of coatings on a running metallic substrate to obtain the coated metallic substrate as recited in claim 1 comprising in the following order:
   a first section including an electron beam evaporation device; and
   a second section including a jet vapor evaporation device.

22. The installation as recited in claim 21 further comprising an intermediate section including a magnetron cathode pulverization device upstream from the first section.

23. The installation as recited in claim 22 wherein the magnetron cathode pulverization device includes a vacuum deposition chamber including one target made of iron, chromium, nickel and optionally titanium, and a plasma source to deposit an intermediate layer comprising iron, nickel, chromium and optionally titanium on the metallic substrate.

24. The installation as recited in claim 21 wherein in the first section, the electron beam evaporation device includes a vacuum deposition chamber including an evaporation crucible including metal consisting of aluminum, a heating device and an electron gun.

25. The installation as recited in claim 21 wherein in the second section, the jet vapor evaporation device includes a vacuum deposition chamber including a vapor jet coater and at least one evaporation crucible suited to feed the vapor jet coater with a vapor comprising from 0.5 to 5.9% by weight of magnesium, the balance being zinc.

26. The coated metallic substrate as recited in claim 1, wherein the thickness of the first coating is between 2 and 3 μm.

* * * * *